Aug. 8, 1961 J. P. BEESLEY 2,995,710

POWER AMPLIFIER CIRCUIT

Filed April 24, 1956

INVENTOR.
JAMES P. BEESLEY

BY Joseph J. Connerton

ATTORNEY

United States Patent Office 2,995,710

Patented Aug. 8, 1961

2,995,710

POWER AMPLIFIER CIRCUIT

James P. Beesley, Poughkeepsie, N.Y., assignor to International Business Machines Corporation, New York, N.Y., a corporation of New York Filed Apr. 24, 1956, Ser. No. 580,356
4 Claims. (Cl. 328—58)

The present invention relates to an electronic circuit and more particularly to an electronic circuit adapted to prevent an output signal from being applied continuously to a load in the event of a continuous input signal.

In a conventional amplifier circuit, the load driven by such circuit may be designed to operate over a particular duty cycle, i.e., the ratio of pulse duration time to pulse repetition time. Thus, if an input signal remains "locked" in its upper level and is thereby effectively applied as a continuous D.C. level, the load device may be seriously impaired or destroyed due to the application of a continuous signal thereon. This would be particularly true in a power amplifier circuit where a continuous heavy current would be applied to the load device.

In accordance with the principles of the present invention, there is provided an improved power amplifier circuit adapted to prevent the output signal of the apparatus from exceeding a predetermined duration.

One of the objects of the present invention is to provide an improved electronic circuit adapted to terminate the output signal after a predetermined duration irrespective of the duty cycle of the input signal.

Another object of the present invention is to provide an improved amplifier incorporating a protection circuit adapted to prevent a continuous signal being applied to the load irrespective of the duration of the applied input signal.

Another object of the present invention is to provide an improved power amplifier circuit incorporating an electronic switch adapted to terminate an output signal after a predetermined time interval.

Another object of the invention is to provide an improved electronic circuit adapted to power amplify an input signal and to terminate the output signal if the input signal is not terminated within a predetermined time duration and further adapted to maintain the output signal within predetermined amplitude limits.

Other objects of the invention will be pointed out in the following description and claims and illustrated in the accompanying drawings, which disclose, by way of example, the principle of the invention and the best mode, which has been contemplated, of applying that principle.

A power amplifier circuit is frequently employed to couple the signal from a signal source to a load device. The preferred embodiment herein described functions to prevent the duty cycle of the load device from being exceeded by terminating the output signal applied to the load after a predetermined interval irrespective of the condition of the input signal.

As is well known in the art, a power cathode follower is a power amplifying circuit having a gain of approximate unity and adapted to provide an output signal having the approximate waveform of the input signal. In the preferred embodiment herein described, the output signal will be maintained between predetermined upper and lower limits of +10 and −30 volts respectively. However, it is recognized that such output levels have been selected merely to illustrate a specific embodiment of the present apparatus and are in no way a limitation of any circuit incorporating the principles of the present invention.

The subject apparatus includes an input amplifier stage which functions to provide a signal having characteristics determined by the input signal, and an output cathode follower stage to provide the desired power amplification.

Figure 1:
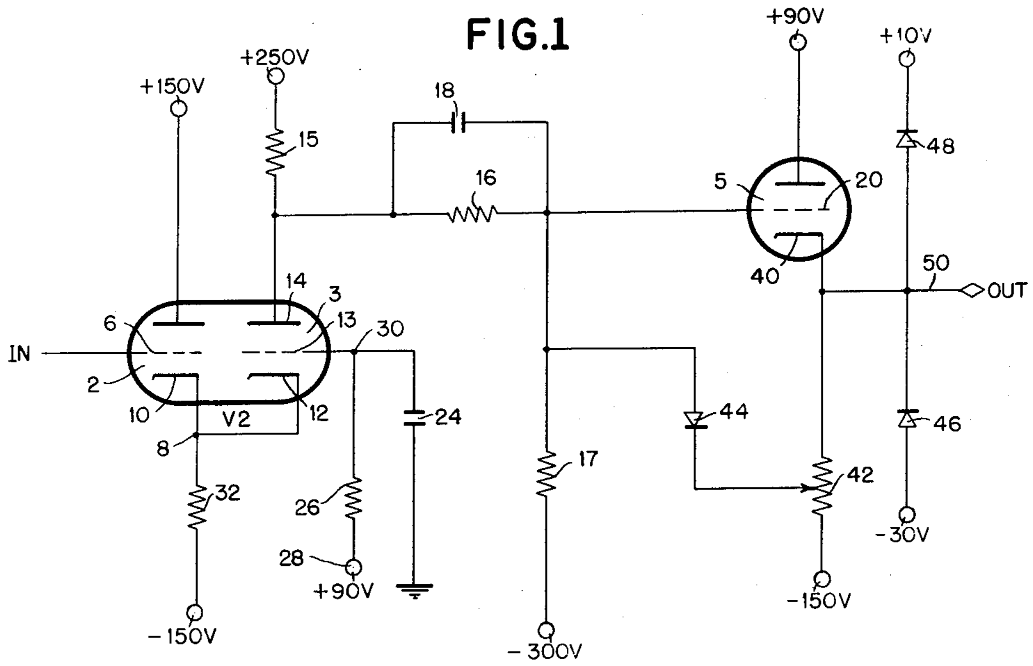
FIG. 1 illustrates in schematic form the power amplifier circuit.

Referring to FIGURE 1, during normal circuit operation, i.e., prior to the application of an input signal, vacuum tube 2 is cutoff and vacuum tube 3 conducting. Assuming a positive going input signal of sufficient magnitude to initiate conduction is applied to control grid 6, tube 2 conducts, thereby increasing the potential at junction 8 of cathodes 10 and 12. The potential transition at cathode 12 is sufficient to cutoff normally conducting tube 3, producing a resultant rising potential at anode 14 which is applied through a coupling circuit to control grid 20 of cathode follower 5. Resistor 15 constitutes the plate load of vacuum tube 3, while resistors 16 and 17, connected between anode 14 and the minus 300 volt supply constitute a voltage divider network which functions to limit the level of the output signal at anode 14 to a level compatible to that of the desired output signal from the cathode follower stage. Capacitor 18 is a coupling capacitor in the RC coupling network connecting the anode of tube 3 to the control grid of cathode follower 5.

When tube 3 is cutoff in the manner above described, capacitor 24, one side of which is connected to ground, begins to charge through resistor 26 toward +90 volts shown at terminal 28. Since the time constant of this RC circuit is controlled by the selected value of the components, after a predetermined time duration, the potential developed at point 30 by the charging of capacitor 24 and applied to control grid 13 will exceed the cutoff value of tube 3 after a predetermined interval thereby causing vacuum tube 3 to resume conduction. Tube 3 normally operates in the grid current region to provide a stable lower reference level at the anode 14 both under quiescent conditions and following the transition from the non-conducting to the conducting state.

Assuming the input signal to control grid 6 of vacuum tube 2 does not return to its lower level and vacuum tubes 2 and 3 are conducting, circuit parameters are selected so that vacuum tube 3 supplies most of the current through common cathode resistor 32. Thus, while vacuum tube 2 may remain in the conducting state, its conduction will be considerably less than that of tube 3 and will approach cutoff. It should be noted that the current flow through resistor 15 and vacuum tube 3 must be adequate to lower the potential at anode 14 sufficiently to maintain cathode follower circuit 5 in a substantially non-conducting state.

Assume now that the input signal applied to the control grid 6 of vacuum tube 2 returns to its lower level before the capacitor 24 charges sufficiently so as to raise the point 30 above the cut off value of vacuum tube 3. The drop in signal at grid 6 will cause tube 2 to cease conducting, causing the potential at the junction 8 of the cathodes 10 and 12 to decrease. This decrease in cathode potential causes tube 3 to begin conducting once again. Thus, the tube 3 is cut off by the conduction of tube 2, and is made to conduct by the first to occur of tube 2 cutting off, or capacitor 24 charging sufficiently.

As heretofore described, resistors 16 and 17, connected between anode 14 of vacuum tube 3 and −300 volt supply, constitute part of a voltage divider network which is adjusted to maintain the signal level of the output of vacuum tube 3 at a level compatible to that of the desired output signal, since the gain of the cathode follower output stage is approximately unity. Thus, during conduction of tube 3, for example, the level of the input signal applied to control grid 20 of the cathode follower stage and to the cathode of diode 44 will be on a relative order of magnitude of —30 volts. Since the anode of diode 44 is connected to —30 volts through variable resistor 42 and diode 46, diode 44 has a zero potential thereacross.

The clipping circuit comprising variable resistor 42 and diodes 44 and 46, functions with associated cathode follower 5 in the following manner. During normal operation, i.e., prior to an input signal being received at the input conductor 1, the cathode 40 of cathode follower 5 is maintained at a potential of —30 volts by means of diode 46 and, as heretofore described, both the anode and cathode of diode 44 are at substantially the same level. Upon receipt of a positive going input signal, the resulting positive signal generated at anode 14 of vacuum tube 3 is applied to control grid 20 of cathode follower 5. Variable resistor 42 is adjusted to limit the back potential developed across diode 44 to a nominal value. In the preferred embodiment the maximum back potential developed across diode 44 is approximately 4 volts.

As the control grid of the cathode follower swings positive, the cathode follows the grid to a maximum level of +10 volts limited by the output clipping circuit including diode 48. The potential between the cathode and variable arm of resistor 42 will vary as the input signal to the cathode follower, so that the potential at the anode of diode 44 will rise to approximately +6 volts. Thus the back potential developed across diode 44 remains at a low value despite the level of the input signal.

The main function performed by diode 44, however, is to prevent the input signal to the cathode follower circuit from dropping below —34 volts. By maintaining the control grid of the cathode follower stage at a potential slightly below the cut off level, the turn-on delay and transition time of the cathode follower stage are substantially reduced. If the input signal drops below the prescribed lower level, the anode of diode 44 becomes positive with respect to the cathode and diode 44 conducts thereby raising the level of the input signal to the prescribed minimum value. Thus the desired clipping action is obtained and the corresponding limitations of the conventional diode clipping circuits are eliminated.

Figure 2:
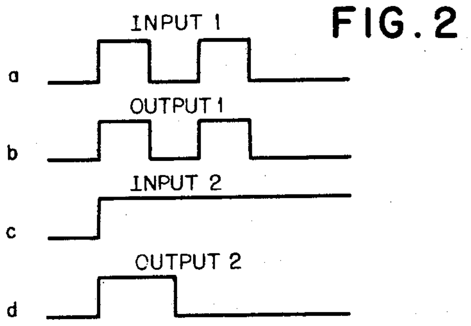
FIG. 2 illustrates a family of waveforms identifying input and output signals under normal and abnormal operating conditions.

Referring now to FIG. 2, there is shown a family of waveforms to illustrate operation of the subject apparatus. It is to be understood that the waveforms of FIGS. 2*a* through 2*d* do not represent actual quantitative values, but merely represent in a general way the qualitative variations of the voltage with time.

Curve "*a*" of FIG. 2 illustrates an example of input signals which might be applied to the subject apparatus. The input waveform shown by way of example is a square wave having a duty cycle of 0.5.

Curve "*b*" of FIG. 2 illustrates the output signals of the subject apparatus assuming input signals represented by curve "*a*." As shown, the output signals from the preferred embodiment are substantially identical in waveform and potential magnitude to those of the input signals.

Curve "*c*" of FIG. 2 illustrates an input signal of the type against which the subject invention is designed to protect. The signal as shown comprises a continuous D.C. signal which remains "locked" in the up position for an indeterminate period.

Curve "*d*" of FIG. 2 illustrates an output signal under the assumed input signal represented by curve "*c*." While a relative duration is shown, the duration of the output signal is a matter of design which is determined by the selected values of the components in the timing network of resistor 26 and capacitor 24.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A power amplifier circuit comprising in combination first, second and third vacuum tubes, each of said vacuum tubes having cathode, anode and control grid elements, said first and second vacuum tubes having a common cathode circuit, means responsive to an input signal applied to the control grid of said first vacuum tube for producing a signal of corresponding polarity at the anode of said second vacuum tube, a coupling circuit connecting the anode of said second vacuum tube to the control grid of said third vacuum tube, an output circuit connected to said cathode of said third vacuum tube, said output circuit including an output terminal and a source of reference potential, a unidirectional conductive device interconnected between said cathode and said control grid of said third vacuum tube for establishing a bias on said control grid and for limiting the amplitude of the signal applied to said control grid and a timing circuit connected to said control grid of said second vacuum tube and adapted to terminate said output signal after a predetermined time interval to thereby control the maximum duration of said output signal.

2. A circuit adapted to provide a power amplified version of an input signal and to automatically terminate said output signal if it exceeds a predetermined duration comprising in combination first, second and third vacuum tubes, each of said vacuum tubes including at least a cathode, an anode and a control grid, said first and second vacuum tubes having normally opposite states of conduction, means responsive to an input signal applied to said control grid of said first vacuum tube for reversing the states of said first and second vacuum tubes and generating a signal at the anode of said second vacuum tube indicative of said transition, means connecting the anode of said second vacuum tube to the control grid of said third vacuum tube, a unidirectional conductive device interconnected between a point in a cathode circuit and said control grid of said third vacuum tube, a voltage divider network including a potential source and an impedance in said cathode circuit of said third vacuum tube connected to said unidirectional conductive device and adapted to provide a source of reference potential thereto and a timing circuit connected to the control grid of said second vacuum tube adapted to terminate said output signal if said input signal exceeds a predetermined duration.

3. A power amplifier circuit adapted to produce an output signal having substantially the same phase and duration as the input signal applied thereto but further adapted to automatically terminate said output signal whenever it exceeds a predetermined duration comprising in combination an amplifier stage including first and second vacuum tubes having normally opposite states of conduction, each of said vacuum tubes having input and output circuits, said amplifier stage being responsive to a signal applied to the input circuit associated with one of said vacuum tubes for reversing the conduction state of said first and second vacuum tubes for the duration of said input signal or said predetermined duration, an output circuit comprising a third vacuum tube, each of said vacuum tubes having cathode, control grid and anode elements, means interconnecting the anode of said second vacuum tube to the control grid of said third vacuum tube, an output circuit connected to said cathode of said third vacuum tube, said output circuit including a first unidirectional conductive device connected to a source of reference potential, said output circuit further including a point where the potential varies as a direct function of the instantaneous value of said input signal, a second unidirectional device interconnected between said point and the control grid of said third vacuum tube and a timing circuit connected to the control grid of said second vacuum tube to terminate conduction therein whenever said input signal exceeds said predetermined duration.

4. An electronic circuit adapted to generate an output signal varying substantially in phase and duration with an input signal applied thereto while maintaining said output signal within predetermined amplitude limits and further adapted to terminate said output signal after a maximum time duration comprising first and second vacuum tubes having normally opposite states of conduction, means responsive to said input signal for reversing the conduction states of said vacuum tubes for a time interval corresponding to the shorter one of the duration of said input signal and said maximum time duration, said reversals resulting in an output signal corresponding in duration to the shorter one of that of said input signal and said maximum time duration, a timing circuit for ensuring termination of said output signal after said maximum time duration to thereby control the maximum duration of said input signal, an output circuit comprising a cathode follower having an input and output circuit, means for applying said output signal to said cathode follower input circuit, means for establishing a reference potential at a point on said output circuit and a unidirectional conductive device interconnected between said point on said output circuit and said input circuit for controlling the bias on said input circuit of said cathode follower to permit more rapid response to signals applied thereto.

References Cited in the file of this patent

UNITED STATES PATENTS

| | | |
|---|---|---|
| 2,468,687 | Schmitt | Apr. 26, 1949 |
| 2,469,860 | Cockrell | May 10, 1949 |
| 2,497,693 | Shea | Feb. 14, 1950 |
| 2,498,490 | Hall | Feb. 21, 1950 |
| 2,562,660 | Chance | July 31, 1951 |
| 2,572,080 | Wallace | Oct. 23, 1951 |
| 2,807,716 | Steele | Sept. 24, 1957 |
| 2,906,871 | Crawford | Sept. 29, 1959 |